(12) United States Patent
Xia et al.

(10) Patent No.: US 11,604,035 B2
(45) Date of Patent: Mar. 14, 2023

(54) SUPPORT PLATEHEAT DISSIPATION APPARATUS

(71) Applicant: HUAWEI TECHNOLOGIES CO., LTD., Guangdong (CN)

(72) Inventors: Zaizhong Xia, Shanghai (CN); Yun Tang, Shanghai (CN); Wen Fang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 1259 days.

(21) Appl. No.: 14/525,733

(22) Filed: Oct. 28, 2014

(65) Prior Publication Data

US 2015/0090435 A1    Apr. 2, 2015

Related U.S. Application Data

(63) Continuation of application No. PCT/CN2014/076730, filed on May 4, 2014.

(30) Foreign Application Priority Data

Sep. 29, 2013 (CN) .......................... 201310454763.9

(51) Int. Cl.
   *F28F 3/00* (2006.01)
   *F28F 3/02* (2006.01)
   (Continued)

(52) U.S. Cl.
   CPC .................. *F28F 3/00* (2013.01); *F28F 3/02* (2013.01); *F28F 13/06* (2013.01);
   (Continued)

(58) Field of Classification Search
   CPC ......... H01L 2924/0002; H01L 2924/00; H01L 23/467; H01L 23/3672; H01L 23/427;
   (Continued)

(56) References Cited

U.S. PATENT DOCUMENTS

| | | | | |
|---|---|---|---|---|
| 3,180,404 A | * | 4/1965 | Nelson ................... | H01C 1/084 165/185 |
| 3,592,260 A | * | 7/1971 | Berger ................... | F28F 13/06 165/121 |

(Continued)

FOREIGN PATENT DOCUMENTS

| | | |
|---|---|---|
| CN | 2338792 | 9/1999 |
| CN | 201476662 | 5/2010 |

(Continued)

OTHER PUBLICATIONS

English Translation of CN201589564.*

(Continued)

*Primary Examiner* — Tho V Duong
(74) *Attorney, Agent, or Firm* — Fish & Richardson P.C.

(57) ABSTRACT

Embodiments of the present invention relate to a heat dissipation apparatus and relates to the field of heat dissipation technologies, so as to solve a problem that heat dissipation efficiency of heat dissipation fins of an existing heat dissipation apparatus is low. In embodiments of the present invention, the heat dissipation apparatus includes a base plate, where multiple main fins are disposed on the base plate, and multiple auxiliary fins are disposed on the main fins; a gap exists between the auxiliary fins and the base plate; and a blocking structure is disposed and fastened on the base plate and/or the main fins, and the blocking structure can make cooling airflow first flow along the auxiliary fins and then flow along gaps between adjacent main fins and flow out. The present invention is mainly used in the field of communication accessories.

6 Claims, 15 Drawing Sheets

(51) Int. Cl.
  *F28F 13/06*    (2006.01)
  *H01L 23/367*   (2006.01)
  *H01L 23/467*   (2006.01)

(52) U.S. Cl.
  CPC ....... *F28F 2215/10* (2013.01); *H01L 23/3672* (2013.01); *H01L 23/3677* (2013.01); *H01L 23/467* (2013.01); *H01L 2924/0002* (2013.01)

(58) Field of Classification Search
  CPC .. F28F 3/02; F28F 3/00; F28F 2215/14; F28F 2215/10; F28F 13/06; F28D 2021/0029; F28D 15/0275
  USPC ....................................... 165/80.3
  See application file for complete search history.

(56) References Cited

U.S. PATENT DOCUMENTS

| | | | | |
|---|---|---|---|---|
| 4,270,604 A * | 6/1981 | Nakamura | F28F 3/02 | 165/185 |
| 4,345,643 A * | 8/1982 | Dawson | F28F 3/12 | 165/122 |
| 4,777,560 A * | 10/1988 | Herrell | H01L 23/3672 | 165/185 |
| 5,132,780 A * | 7/1992 | Higgins, III | H01L 23/467 | 165/104.34 |
| 5,195,576 A * | 3/1993 | Hatada | H05K 7/1015 | 257/E23.105 |
| 5,201,866 A * | 4/1993 | Mok | F28F 3/02 | 165/185 |
| 5,205,353 A * | 4/1993 | Willemsen | F28F 13/003 | 165/170 |
| 5,294,831 A * | 3/1994 | Azar | F28F 3/02 | 165/80.3 |
| 5,304,845 A * | 4/1994 | Lindquist | H01L 23/467 | 165/80.3 |
| 5,304,846 A * | 4/1994 | Azar | F28F 3/02 | 165/80.3 |
| 5,329,996 A * | 7/1994 | Rosenfeld | F28F 13/003 | 165/168 |
| 5,335,143 A * | 8/1994 | Maling, Jr. | H05K 7/20154 | 165/122 |
| 5,369,301 A * | 11/1994 | Hayashi | H01L 21/4882 | 165/80.3 |
| 5,375,655 A * | 12/1994 | Lee | F28F 3/02 | 165/185 |
| 5,421,406 A * | 6/1995 | Furusawa | H01L 23/3677 | 165/185 |
| 5,424,251 A * | 6/1995 | Sono | H01L 21/565 | 257/E21.504 |
| 5,455,382 A * | 10/1995 | Kojima | H01L 21/4878 | 165/80.3 |
| 5,494,098 A * | 2/1996 | Morosas | H01L 23/467 | 165/121 |
| 5,519,938 A * | 5/1996 | Kojima | H01L 21/4878 | 125/21 |
| 5,535,816 A * | 7/1996 | Ishida | F28F 3/02 | 165/104.33 |
| 5,609,201 A * | 3/1997 | Anderson | F28F 3/12 | 257/722 |
| 5,609,202 A * | 3/1997 | Anderson | F28F 3/12 | 165/122 |
| 5,625,229 A * | 4/1997 | Kojima | F28F 3/025 | 257/712 |
| 5,699,853 A * | 12/1997 | Goth | H01L 23/427 | 165/104.21 |
| 5,704,419 A * | 1/1998 | Agonafer | F28F 3/12 | 165/121 |
| 5,706,169 A * | 1/1998 | Yeh | H01L 23/467 | 165/120 |
| 5,726,495 A * | 3/1998 | Aihara | H01L 21/4878 | 165/80.3 |
| 5,727,622 A * | 3/1998 | Gurevich | F28F 13/003 | 165/122 |
| 5,785,116 A * | 7/1998 | Wagner | H01L 23/467 | 165/122 |
| 5,876,831 A * | 3/1999 | Rawal | B32B 3/12 | 428/117 |
| 5,884,691 A * | 3/1999 | Batchelder | F28F 3/022 | 165/185 |
| 5,932,925 A * | 8/1999 | McIntyre | H01L 23/4093 | 165/185 |
| 5,957,194 A * | 9/1999 | Azar | F28F 3/02 | 165/185 |
| 6,102,112 A * | 8/2000 | Herzl | H05K 7/20445 | 165/185 |
| 6,125,921 A * | 10/2000 | Kuo | H01L 23/3672 | 165/185 |
| 6,160,696 A * | 12/2000 | Bailey | H05K 7/1432 | 361/100 |
| 6,161,610 A * | 12/2000 | Azar | H01L 23/467 | 257/722 |
| 6,176,299 B1 * | 1/2001 | Hanzlik | H01L 23/467 | 165/121 |
| 6,233,149 B1 * | 5/2001 | Bailey | H02M 7/003 | 165/104.33 |
| 6,263,955 B1 * | 7/2001 | Azar | F28F 3/02 | 165/185 |
| 6,313,399 B1 * | 11/2001 | Suntio | H01L 23/367 | 174/16.3 |
| 6,333,852 B1 * | 12/2001 | Lin | G06F 1/20 | 165/121 |
| 6,360,816 B1 * | 3/2002 | Wagner | H01L 23/467 | 165/122 |
| 6,366,461 B1 * | 4/2002 | Pautsch | H01L 23/467 | 361/689 |
| 6,397,931 B1 * | 6/2002 | Lin | F28F 3/027 | 165/185 |
| 6,442,024 B1 * | 8/2002 | Shih | G06F 1/20 | 165/121 |
| 6,478,082 B1 * | 11/2002 | Li | F28F 3/02 | 165/185 |
| 6,615,909 B2 * | 9/2003 | Fast | H01L 23/3672 | 165/185 |
| 6,668,910 B2 * | 12/2003 | Gawve | H01L 23/3672 | 165/121 |
| 6,702,001 B2 * | 3/2004 | Delano | H01L 23/4093 | 165/185 |
| 6,779,595 B1 * | 8/2004 | Chiang | H01L 23/467 | 165/185 |
| 6,830,097 B2 * | 12/2004 | Wattelet | F28F 3/025 | 165/104.21 |
| 6,945,318 B2 * | 9/2005 | Ma | H01L 23/427 | 165/104.33 |
| 6,964,295 B1 * | 11/2005 | Yu | H01L 23/467 | 165/80.4 |
| 6,968,890 B1 * | 11/2005 | Ghantiwala | F28D 15/0275 | 165/104.21 |
| 6,981,542 B2 * | 1/2006 | Lopatinsky | H01L 23/467 | 165/185 |
| 7,117,928 B2 * | 10/2006 | Chen | F28F 3/04 | 165/104.34 |
| 7,143,564 B2 * | 12/2006 | Renck | E04C 2/365 | 52/745.05 |
| 7,228,889 B1 * | 6/2007 | Tian | H01L 23/427 | 165/104.34 |
| 7,233,496 B2 * | 6/2007 | Lee | H01L 23/4093 | 257/E23.086 |
| 7,277,281 B1 * | 10/2007 | Lu | H01L 23/4006 | 165/104.21 |
| 7,409,983 B2 * | 8/2008 | Lin | F28F 3/02 | 165/104.33 |
| 7,434,610 B2 * | 10/2008 | Hwang | G06F 1/20 | 165/122 |
| 7,447,020 B2 * | 11/2008 | Xia | H01L 23/467 | 257/E23.099 |
| 7,447,027 B2 * | 11/2008 | Xia | H01L 23/427 | 257/E23.099 |

(56) References Cited

U.S. PATENT DOCUMENTS

| | | | | |
|---|---|---|---|---|
| 7,575,045 B2* | 8/2009 | Sheng | F28D 15/0275 | 165/104.21 |
| 7,728,467 B2* | 6/2010 | Aoki | H01L 21/4878 | 310/54 |
| 7,766,074 B2* | 8/2010 | Lin | H01L 23/467 | 165/104.33 |
| 7,869,213 B2* | 1/2011 | Chen | G06F 1/203 | 165/121 |
| 8,210,242 B2* | 7/2012 | Li | H01L 23/3672 | 165/104.33 |
| 8,243,451 B2* | 8/2012 | Dede | F28F 3/046 | 165/104.33 |
| 8,322,889 B2* | 12/2012 | Petroski | F04D 33/00 | 361/694 |
| 8,810,464 B2* | 8/2014 | Anderson | H04B 7/18508 | 343/754 |
| 2005/0087329 A1* | 4/2005 | Zhang | F28D 15/0275 | 165/122 |
| 2006/0279926 A1* | 12/2006 | Koo | G06F 1/20 | 361/688 |
| 2008/0101018 A1* | 5/2008 | Long | H01L 23/467 | 361/695 |
| 2008/0151498 A1* | 6/2008 | Zhang | G06F 1/20 | 361/697 |
| 2009/0049861 A1* | 2/2009 | Luo | F25B 39/04 | 62/498 |
| 2009/0195990 A1* | 8/2009 | Honma | F28F 3/022 | 361/710 |
| 2009/0310372 A1* | 12/2009 | Zhou | F21V 29/763 | 362/373 |
| 2010/0071875 A1* | 3/2010 | Hwang | F04D 29/422 | 165/80.3 |
| 2010/0096107 A1* | 4/2010 | Lian | F28D 15/0233 | 165/80.3 |
| 2010/0193162 A1* | 8/2010 | Liang | H01L 23/3672 | 165/104.34 |
| 2010/0258271 A1* | 10/2010 | Xu | H01L 23/3672 | 165/80.3 |
| 2010/0288475 A1* | 11/2010 | Cao | H01L 23/4006 | 165/121 |
| 2011/0127012 A1* | 6/2011 | Ma | H01L 23/427 | 165/104.26 |
| 2011/0141686 A1* | 6/2011 | Liu | H01L 23/3672 | 361/679.47 |
| 2011/0232880 A1* | 9/2011 | Tang | G06F 1/20 | 165/121 |
| 2011/0277969 A1* | 11/2011 | Chang | H01L 23/467 | 165/121 |
| 2012/0103572 A1* | 5/2012 | Hwang | F28D 15/0275 | 165/104.26 |
| 2012/0175079 A1* | 7/2012 | Chang | F04D 29/441 | 165/96 |

FOREIGN PATENT DOCUMENTS

| | | | |
|---|---|---|---|
| CN | 201476662 U | * | 5/2010 |
| CN | 201476670 | | 5/2010 |
| CN | 201589564 | | 9/2010 |
| CN | 201589564 U | * | 9/2010 |
| JP | 8-125366 | | 5/1996 |

OTHER PUBLICATIONS

English Translation of CN201589564 and CN20146662 (Year: 2018).*

Chinese Office Action dated Jul. 5, 2016 in corresponding Chinese Patent Application No. 201310454763.9.

PCT International Search Report dated Jul. 25, 2014 in corresponding International Patent Application No. PCT/CN2014/076730.

* cited by examiner

SUPPORT PLATE HEAT DISSIPATION APPARATUS

CROSS-REFERENCE TO RELATED APPLICATIONS

This application is a continuation of International Application No. PCT/CN2014/076730, filed on May 4, 2014, which claims priority to Chinese Patent Application No. 201310454763.9, filed on Sep. 29, 2013, both of which are hereby incorporated by reference in their entireties.

TECHNICAL FIELD

Embodiments of the present invention relate to the field of heat dissipation technologies, and in particular, to a heat dissipation apparatus.

BACKGROUND

With rapid development of information technologies, a computing speed of an electronic component in most electronic products is becoming increasingly higher, and the electronic component generates increasingly more heat. If excessive heat cannot be dissipated in time, operating stability and service life of the electronic component are severely affected. Therefore, in the industry, a heat dissipation apparatus is generally disposed on an electronic component, and the heat dissipation apparatus is used to help dissipate heat, so as to ensure that the electronic component works properly at an appropriate temperature.

In the prior art, a heat dissipation apparatus generally dissipates heat of an electronic component promptly in a natural heat dissipation manner. Specifically, as shown in FIG. 1, a traditional radiator includes a base plate 10 and heat dissipation fins 11 disposed on the base plate 10. In FIG. 1, multiple heat dissipation fins 11 of a tabular structure are disposed parallel to each other on the base plate 10. When the radiator is used, the base plate 10 is fastened in a position corresponding to a heat source of an electronic component, so that heat generated by the electronic component is transferred to the heat dissipation fins 11 through the base plate 10; and cooling airflow flows in a gap between adjacent heat dissipation fins 11, so as to cool the heat dissipation fins 11 and take away the heat, thereby achieving a purpose of heat dissipation. A flow manner of the cooling airflow in FIG. 1 is indicated by an arrow and is a manner of direct ventilation from bottom to top of the radiator.

In actual application, to enable a heat dissipation apparatus adapt to different environments or devices, as shown in FIG. 2, heat dissipation fins 11 may be made in a slope structure. In this case, a flow manner of cooling airflow is indicated by an arrow in FIG. 2 and is a manner of direct ventilation along a slope direction of the heat dissipation fins 11. Alternatively, heat dissipation fins 11 may be made in a needle-shaped fin structure, as shown in FIG. 3, and the needle-shaped fins are arranged on a base plate 10 in a form of a matrix. In this case, a flow manner of cooling airflow is indicated by an arrow in FIG. 3 and is a manner of direct ventilation in different directions, which are mainly directions of up and down and directions of left and right.

However, the heat dissipation fins 11 in the foregoing three implementation manners need to transfer heat, and the heat is transferred on the heat dissipation fins in a direction away from the base plate 10, thereby causing a thermal cascading phenomenon on the heat dissipation fins 11, that is, a part on the heat dissipation fins 11 that is farther away from the base plate 10 has a higher temperature. However, cooling air flows in the radiator in a direct ventilation manner and cannot properly reach the area of the heat dissipation fins 11, so that a heat dissipation effect of the heat dissipation fins 11 in the part is poor, and overall heat dissipation efficiency of the heat dissipation fins 11 is reduced.

SUMMARY

Embodiments of the present invention provide a heat dissipation apparatus, so as to solve a problem that heat dissipation efficiency of heat dissipation fins of an existing heat dissipation apparatus is low.

To achieve the foregoing purpose, the following technical solutions are adopted in the embodiment of the present invention:

According to a first aspect, a heat dissipation apparatus includes a base plate, where multiple main fins are disposed on the base plate, and multiple auxiliary fins are disposed on the main fins; a gap exists between the auxiliary fins and the base plate; and a blocking structure is disposed and fastened on the base plate and/or the main fins, and the blocking structure can make cooling airflow first flow along the auxiliary fins and then flow along gaps between adjacent main fins and flow out.

In a first possible implementation manner of the first aspect, multiple strip-shaped main fins are extended on one side surface of the base plate, where the multiple main fins are disposed parallel to each other, and lengthwise air ducts are formed between the main fins; the main fins are disposed in a parallel or slope manner relative to a side edge of the base plate; the auxiliary fins are disposed on side walls or on top of the main fins; and the blocking structure is extended at one end of the base plate and on a same side surface as the main fins, and the blocking structure is a baffle plate or a lap-joint wire structure.

With reference to the first possible implementation manner, in a second possible implementation manner, a cover is disposed between a part of the main fins that are adjacent to an end, of the base plate, which is opposite to the blocking structure; alternatively, a support plates are extended on the base plate and on a same side surface as the main fins, the support plates are disposed on an end side, of the main fins, which is opposite to the blocking structure, and a cover is disposed on the support plates.

With reference to the second possible implementation manner, in a third possible implementation manner, the multiple main fins are tabular bodies of a same structure and disposed parallel to a side edge of the base plate; the multiple auxiliary fins are tabular bodies of a same structure and arranged parallel to each other on the main fins, and the auxiliary fins are fastened on the main fins in a plug-in manner and perpendicular to the main fins; the blocking structure is a baffle plate that is located at one end of the main fins and disposed between adjacent main fins, and the baffle plate is disposed perpendicular to the main fins; the cover is disposed between a part of adjacent main fins that are away from the blocking structure, and the cover, the main fins, and the base plate form a ventilation structure; and the ventilation structure and the baffle plate are located on two opposite sides of the auxiliary fins.

With reference to the second possible implementation manner, in a fourth possible implementation manner, the multiple main fins are tabular bodies of a same structure and disposed parallel to a side edge of the base plate; the multiple auxiliary fins are columnar bodies of a same structure, the auxiliary fins are located on side walls of the main fins and arranged in order between adjacent main fins, and the auxiliary fins are disposed perpendicular to the main fins; the blocking structure is a baffle plate that is located at one end of the main fins and disposed between adjacent main fins, and the baffle plate is disposed perpendicular to the main fins; the cover is disposed between a part of adjacent main fins that are away from the blocking structure, and the cover, the main fins, and the base plate form a ventilation structure; and the ventilation structure and the baffle plate are located on two opposite sides of the auxiliary fins.

With reference to the second possible implementation manner, in a fifth possible implementation manner, the multiple main fins are tabular bodies of a same structure and disposed parallel to a side edge of the base plate; the multiple auxiliary fins are crescent-shaped structures of a same structure, the auxiliary fins are located on top of the main fins and arranged parallel to each other between adjacent main fins, and the auxiliary fins are disposed perpendicular to the main fins; the blocking structure is a baffle plate that is located at one end of the main fins and disposed between adjacent main fins, and the baffle plate is disposed perpendicular to the main fins; arched plates are disposed between a part of adjacent main fins that are away from the blocking structure, and the arched plates, the main fins, and the base plate form a ventilation structure; and the ventilation structure and the baffle plate are located on two opposite sides of the auxiliary fins.

With reference to the second possible implementation manner, in a sixth possible implementation manner, the multiple main fins are tabular bodies of a same structure and disposed parallel to a side edge of the base plate; the multiple auxiliary fins are block bodies of a same structure, the auxiliary fins are located on side walls of the main fins and disposed perpendicular to the main fins, two groups disposed symmetrically are formed between adjacent main fins, and auxiliary fins in each group are parallel to each other; the blocking structure is a baffle plate that is located at one end of the main fins and disposed between adjacent main fins, and the baffle plate is disposed perpendicular to the main fins; the cover is disposed between a part of adjacent main fins that are away from the blocking structure, and the cover, the main fins, and the base plate form a ventilation structure; and the ventilation structure and the baffle plate are located on two opposite sides of the auxiliary fins.

With reference to the second possible implementation manner, in a seventh possible implementation manner, the multiple main fins are tabular structures and disposed in a slope manner relative to a side edge of the base plate; the multiple auxiliary fins are tabular bodies of a same structure and arranged parallel to each other on the main fins, the auxiliary fins are fastened on the main fins in a plug-in manner, and a certain angle exists between the auxiliary fins and the main fins; the auxiliary fins are disposed parallel to a side edge of the base plate; the blocking structure is a baffle plate that is located at one end of the main fins and disposed parallel to the base plate; support plates perpendicular to the base plate are disposed on an end side, on the base plate, of the main fins, which is opposite to the blocking structure, a cover parallel to the base plate is disposed on the support plates, and the cover, the support plates, and the base plate form a ventilation structure; and an air intake vent of the ventilation structure is corresponding to an air exhaust vent of the lengthwise air duct.

With reference to the seventh possible implementation manner, in an eighth possible implementation manner, the air exhaust vent of the ventilation structure is provided at one end opposite to the air intake vent; alternatively, the air exhaust vent of the ventilation structure is provided at one end that is adjacent to the air intake vent and corresponding to a slope direction of the main fins.

With reference to the second possible implementation manner, in a ninth possible implementation manner, the multiple main fins are columnar bodies of a same structure and arranged on the base plate in a form of a matrix; the multiple auxiliary fins are tabular structures of a same structure and separately fastened on each row of main fins, and the multiple auxiliary fins are disposed parallel to each other; the blocking structure is a baffle plate perpendicular to the base plate and fastened on a horizontal row of main fins that are adjacent to one end of the base plate; support plates perpendicular to the base plate are disposed on an end side, on the base plate, of the main fins, which is opposite to the blocking structure, a cover parallel to the base plate is disposed on the support plates, and the cover, the support plates, and the base plate form a ventilation structure; an air intake vent of the ventilation structure is corresponding to an air exhaust vent of the lengthwise air duct; and separating plates parallel to the base plate are further disposed on vertical main fins that are located on two end sides of the base plate.

With reference to the second possible implementation manner, in a tenth possible implementation manner, the multiple main fins are columnar bodies of a same structure and arranged on the base plate in a form of a matrix; the auxiliary fins are wire strips, and the auxiliary fins are connected between the main fins in a staggered manner; the blocking structure is a lap-joint wire structure formed by the auxiliary fins that are intertwined densely and located between a horizontal row of main fins that are adjacent to one end of the base plate; support plates perpendicular to the base plate are disposed on an end side, on the base plate, of the main fins, which is opposite to the blocking structure, a cover parallel to the base plate is disposed on the support plates, and the cover, the support plates, and the base plate form a ventilation structure; and an air intake vent of the ventilation structure is corresponding to an air exhaust vent of the lengthwise air duct.

With reference to the tenth possible implementation manner, in an eleventh possible implementation manner, the auxiliary fins are aluminum wires or copper wires.

With reference to the second possible implementation manner, in a twelfth possible implementation manner, heat dissipation teeth are disposed on the cover, where the heat dissipation teeth are configured to accelerate dissipation of heat of airflow.

With reference to the first to the twelfth possible implementation manners, in a thirteenth possible implementation manner, a material of the main fins is a metal material.

With reference to the first possible implementation manner, in a fourteenth possible implementation manner, the multiple main fins are tubular bodies of a same structure and disposed parallel to a side edge of the base plate; the multiple auxiliary fins are tabular bodies of a same structure and arranged parallel to each other on the main fins, and the auxiliary fins are disposed perpendicular to the main fins; and in an extending direction of the main fins, the blocking structure and a hollow cuboid are respectively disposed on two opposite sides of the auxiliary fins.

With reference to the fourteenth possible implementation manner, in a fifteenth possible implementation manner, in a direction perpendicular to the extending direction of the main fins, bracket plates that are connected to the auxiliary fins and parallel to each other are disposed at two ends of the base plate; the hollow cuboid forms a ventilation structure, and a gap exists between the hollow cuboid and the base plate; and the blocking structure is a baffle plate disposed parallel to the base plate.

With reference to the fifteenth possible implementation manner, in a sixteenth possible implementation manner, main fins and auxiliary fins are disposed on two sides of the base plate and disposed symmetrically on the two sides of the base plate; and correspondingly, the hollow cuboid is disposed corresponding to the main fins and the auxiliary fins on the two sides of the base plate.

With reference to the fifteenth or the sixteenth possible implementation manner, in a seventeenth possible implementation manner, through-holes are provided on the auxiliary fins and the main fins, and the main fins pass through and are fastened in the through-holes.

With reference to the seventeenth possible implementation manner, in an eighteenth possible implementation manner, the main fins are heat pipes, graphite, or water pipes.

With reference to the first possible implementation manner, in a nineteenth possible implementation manner, a fan is disposed in an exhaust position of the cooling airflow.

According to the heat dissipation apparatus provided in the embodiments of the present invention, multiple main fins are disposed on a base plate, and multiple auxiliary fins are disposed on the main fins, where a gap exists between the auxiliary fins and the base plate. In addition, a blocking structure that can make most cooling airflow first flow along the auxiliary fins and then flow along gaps between adjacent main fins and flow out is disposed on the base plate and/or the main fins. It can be known from analysis that, by means of a function of the blocking structure, a flow manner of the cooling airflow is changed, that is, a direct ventilation manner in the prior art is changed to a manner in which most cooling airflow first flows along the auxiliary fins and then flows along gaps between adjacent main fins and flows out, so that the auxiliary fins are always located at an entrance where the cooling airflow enters the heat dissipation apparatus. Therefore, when heat generated by a component is transferred to the main fins through the base plate and then transferred from the main fins to the auxiliary fins, heat in the auxiliary fins is quickly reduced by the cooling airflow, without a temperature cascading phenomenon, thereby improving overall heat dissipation efficiency of heat dissipation fins.

DESCRIPTION OF EMBODIMENTS

The following describes a heat dissipation apparatus according to embodiments of the present invention in detail with reference to the accompanying drawings.

Figure 4:
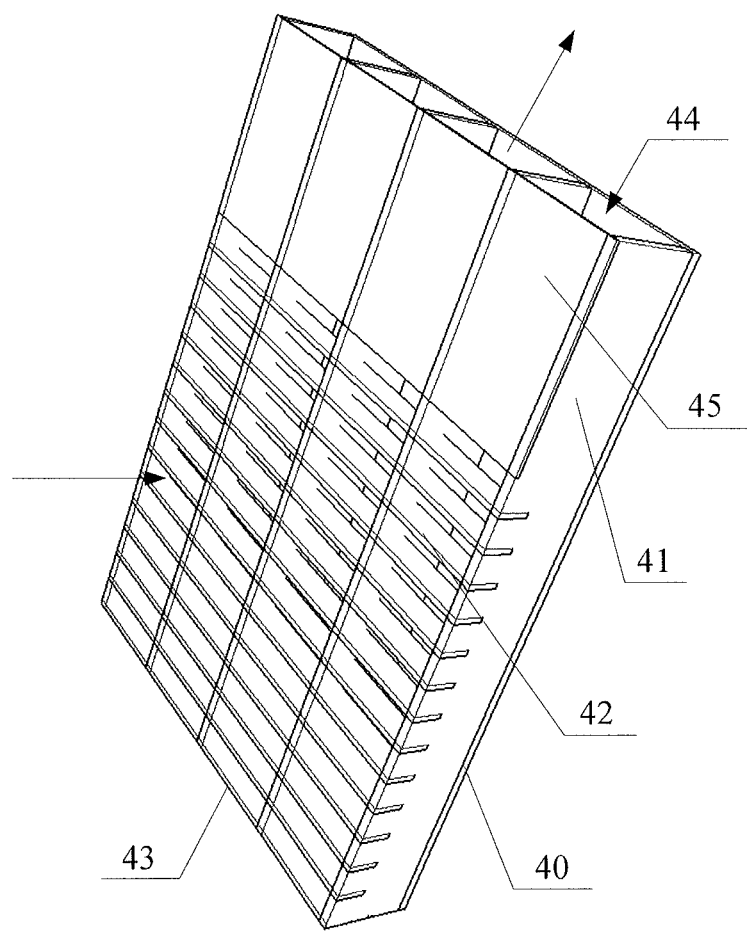
FIG. 4 to FIG. 15 are schematic structural diagrams of heat dissipation apparatuses of different structures according to embodiments of the present invention.

An embodiment of the present invention provides a heat dissipation apparatus, as shown in FIG. 4, including a base plate 40, where multiple main fins 41 are disposed on the base plate 40, and multiple auxiliary fins 42 are disposed on the main fins 41; a gap exists between the auxiliary fins 42 and the base plate 40; and a blocking structure 43 is disposed and fastened on the base plate 40 and/or the main fins 41, and the blocking structure 43 can make cooling airflow first flow along the auxiliary fins 42 and then flow along gaps between adjacent main fins 41 and flow out.

According to the heat dissipation apparatus provided in the embodiment of the present invention, multiple main fins are disposed on a base plate, and multiple auxiliary fins are disposed on the main fins, where a gap exists between the auxiliary fins and the base plate. In addition, a blocking structure that can make most cooling airflow first flow along the auxiliary fins and then flow along gaps between adjacent main fins and flow out is disposed on the base plate and/or the main fins. It can be known from analysis that, by means of a function of the blocking structure, a flow manner of the cooling airflow is changed, that is, a direct ventilation manner in the prior art is changed to a manner in which most cooling airflow first flows along the auxiliary fins and then flows along gaps between adjacent main fins and flows out, so that the auxiliary fins are always located at an entrance where the cooling airflow enters the heat dissipation apparatus. Therefore, when heat generated by a component is transferred to the main fins through the base plate and then transferred from the main fins to the auxiliary fins, heat in the auxiliary fins is quickly reduced by the cooling airflow, without a temperature cascading phenomenon, thereby improving overall heat dissipation efficiency of heat dissipation fins.

It should be noted that, because the cooling airflow needs finally to flow between adjacent main fins and flow out, the gap between the auxiliary fins and the base plate needs to ensure that the cooling airflow can flow smoothly. An appropriate numeric value range of a specific size of the gap may be obtained by a technical person according to multiple tests.

In actual application, in a process in which the cooling airflow flows in the gap between adjacent main fins 41, a heat cascading phenomenon also occurs, that is, a temperature of airflow becomes higher along a flow direction of the airflow in the gap between the main fins 41. Therefore, as shown in FIG. 4, a cover 45 is disposed between a part of the main fins that are adjacent to an end, of the base plate 40, which is opposite to the blocking structure 43, so that in FIG. 4, the part of the main fins 41, the cover 45, and the base plate 40 form a structure of which two ends are ventilated and remaining ends are enclosed. Certainly, a structure for improving a cross ventilation effect may also be formed by using another disposition manner and may be hereinafter referred to as a ventilation structure 44. Thus, the ventilation structure 44 is configured to improve a flow rate of airflow at airflow exhaust ends of the main fins 41, reduce a heat cascading effect, and improve heat dissipation efficiency of the heat dissipation apparatus. The ventilation structure 44 mainly brings a stronger natural flow effect, so as to strengthen a heat dissipation effect of the heat dissipation apparatus.

No matter in what manner the ventilation structure 44 is formed, two ends of the ventilation structure 44 are ventilated, remaining ends are enclosed, and the two ends that are ventilated can make airflow successfully circulate between the two ends in a direction. Specifically, an air intake vent end of the ventilation structure 44 is disposed corresponding to an end at which the cooling airflow of the main fins 41 flows out of lengthwise air ducts, so that after the cooling airflow flows out of the gap between the main fins 41, the cooling airflow can successfully flow into the ventilation structure 44, flow in the ventilation structure 44, and finally flow out of an air exhaust vent of the ventilation structure 44. The air intake vent and the air exhaust vent of the ventilation structure 44 are the two ends that are ventilated, and a flow path of the cooling airflow in the ventilation structure 44 is not limited.

In an actual processing and manufacturing process, multiple strip-shaped main fins 41 may be extended on one side surface of the base plate 40, the multiple main fins 41 are disposed parallel to each other, and lengthwise air ducts are formed between the main fins 41. The main fins 41 are disposed in a parallel or slope manner relative to a side edge of the base plate 40. The auxiliary fins 42 may be disposed on side walls or on top of the main fins 41, and may be specifically disposed according to a requirement. The blocking structure 43 is extended at one end of the base plate 40 and on a same side surface as the main fins 41, the blocking structure 43 is a baffle plate or a lap-joint wire structure, and a specific structure of the blocking structure 43 may be determined according to a requirement. The strip-shaped main fins 41 may be tabular bodies, columnar bodies, tubular bodies, or the like.

Correspondingly, a manner in which the ventilation structure 44 is formed may be that the cover 45 is disposed in a corresponding position on the main fins, so that the cover 45, the main fins 41, and the base plate 40 form the ventilation structure 44; or may also be that a structure such as support plates are disposed on the base plate 40, and the cover 45 is disposed on the support plates, so that the cover 45, the support plates, and the base plate 40 form the ventilation structure 44.

Specifically, as shown in FIG. 4, the multiple main fins 41 are tabular bodies of a same structure, evenly arranged on the base plate 40 parallel to each other and with same spacings, and disposed parallel to a side edge of the base plate 40; alternatively, the multiple main fins 41 are arranged not parallel to each other and with different spacings (considering a case in which another part is disposed on the base plate 40). FIG. 4 includes five main fins 41. The main fins 41 may be made of a metal material with good thermal conduction and heat dissipation performance, for example, aluminum, and fastened on the base plate 40 by using welding, clamping, or another reliable connection manner. In FIG. 4, the main fins 41 are cuboid slabs. Multiple slots are provided along an extending direction of the main fins 41. A total length of the multiple slots in one main fin 41 accounts for ⅔ of an overall length of the main fin 41. The multiple slots in one main fin 41 may be arranged in the main fin 41 parallel to each other and with same spacings, or not parallel and with different spacings, so that when multiple auxiliary fins 42 that are of a same tabular structure are inserted and fastened in the slots, the multiple auxiliary fins 42 may also be arranged parallel to each other and with same spacings, or not parallel and with different spacings, and are perpendicular to the main fins 41. The auxiliary fins 42 are fastened on the main fins 41 in a plug-in manner, which facilitates mounting. When the auxiliary fins 42 are fastened on the main fins, a depth of each slot is equal to a height of a corresponding auxiliary fin, thereby ensuring overall outline design quality, avoiding unevenness, and enlarging contact areas between the auxiliary fins 42 and the main fins 41 for facilitating thermal conduction.

It should be noted that the height of the auxiliary fins 42 (the depth of the slots) is smaller than a height of the main fins 41, thereby ensuring that a gap exists between the auxiliary fins 42 and the base plate 40 after the auxiliary fins 42 are fastened on the main fins 41 and ensuring that the cooling airflow can flow between adjacent main fins 41. In addition, the depth of the slots may be ⅓ of the height of the main fins 41, and the foregoing numeric values are appropriate numeric values determined by testing.

Figure 1:
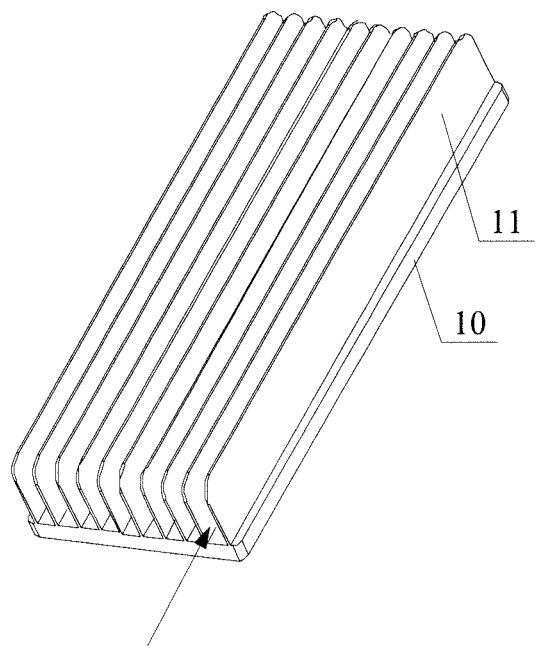
FIG. 1 is a schematic structural diagram of a radiator in the prior art.
Figure 2:
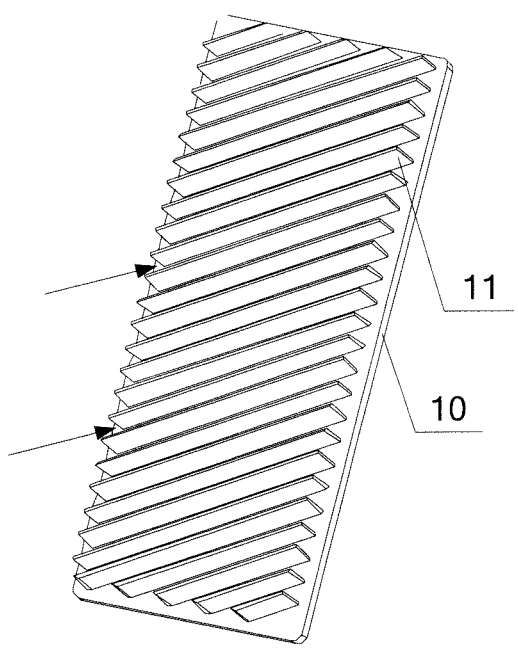
FIG. 2 is a schematic structural diagram of another radiator in the prior art.
Figure 3:
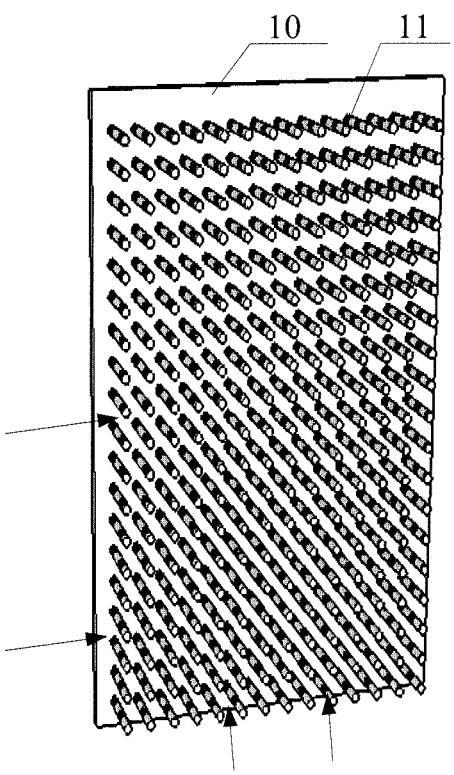
FIG. 3 is a schematic structural diagram of still another radiator in the prior art.

In FIG. 4, in an area of the main fins 41 where no slot is provided, that is, a remaining ⅓ part, the cover 45 is disposed between adjacent main fins 41, and the cover 45 may be fastened on the main fins 41 in a manner of clamping, plug-connection, or the like, so that the cover 45, the main fins 41, and the base plate 40 can form the ventilation structure 44. Specifically, FIG. 1 includes four ventilation structures 44. The ventilation structure 44 is located on one side of the auxiliary fins, and preferably, the cover 45 is disposed on an edge side, of the main fins, which is away from the base plate 40, thereby ensuring that the cooling airflow between adjacent main fins 41 flows along the ventilation structure 44.

To implement that most cooling airflow first flows along the auxiliary fins 42, the blocking structure 43 may be disposed in FIG. 4, that is, a baffle plate in FIG. 4 that is located at one end of the main fins 41 and disposed between adjacent main fins 41, and the baffle plate is disposed perpendicular to the main fins 41. One auxiliary fin 42 may also be disposed at the end of the main fins 41, and a separating plate parallel to the base plate 40 is disposed between the auxiliary fin 42 and the base plate 40, where the number of separating plates may be determined according to a requirement. This manner provides a same function as the blocking structure 13, and the separating plate can allow a small amount of additional cooling airflow to flow between adjacent main fins 41 in a direct ventilation manner, so as to increase a flow rate of airflow and accelerate heat dissipation.

The ventilation structure 44 and the baffle plate are located on two opposite sides of the auxiliary fins 42. Therefore, most cooling airflow flows in a direction indicated by an arrow in FIG. 4, that is, first flows to the auxiliary fins 42 along a direction approximately perpendicular to the base plate 40 (certainly, there may also be other directions), flows in the gap between adjacent main fins 41, flows out to the ventilation structure 44, and finally flows in the ventilation structure 44 and flows out.

It should be noted that, the arrow in FIG. 4 merely indicates a direction of most cooling airflow. Specifically, the cooling airflow comes from various directions. However, the blocking structure can prevent the airflow from flowing in a direct ventilation manner (most cooling airflow merely flows between adjacent main fins 41) and make most cooling airflow first flow along the auxiliary fins 42, that is, the auxiliary fins 42 are always located at an entrance where cooling air enters the heat dissipation apparatus.

Figure 5:
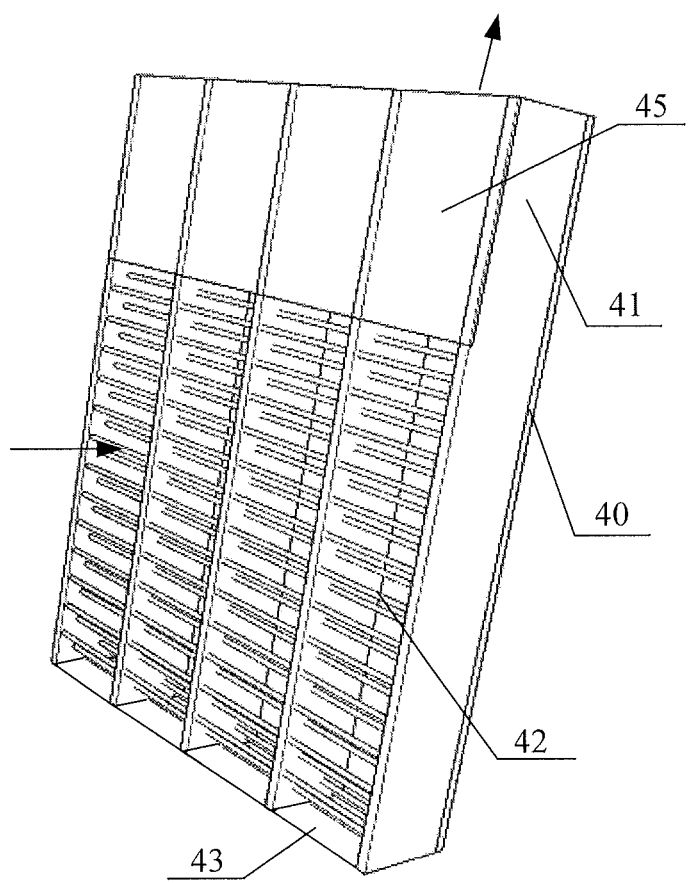

In actual processing and manufacturing, a structure of auxiliary fins 42 may be changed to implement a purpose of diversified and multi-scenario application. As shown in FIG. 5, main fins 41 are of the tabular structure shown in FIG. 4. In this case, no structure such as a slot needs to be disposed on the main fins 41, and design of a cover 45 is the same as that in FIG. 4. Specifically, in FIG. 5, auxiliary fins 42 are columnar bodies, disposed in order between adjacent main fins 41 in a staggered manner, and perpendicular to the main fins 41. The auxiliary fins 42 may be fastened on the main fins 41 by using welding, clamping, or another connection manner, and an arrangement manner may be determined according to multiple tests or experience of a technical person. In FIG. 5, in a direction perpendicular to a base plate 40, auxiliary fins 42 between adjacent main fins 41 form upper and lower layers. Multiple auxiliary fins 42 at each layer are disposed parallel to each other and with same spacings, or not parallel and with different spacings, and the auxiliary fins 42 at the two layers are disposed in a staggered manner, that is, each auxiliary fin 42 at the upper layer is corresponding to a position between two adjacent auxiliary fins 42 at the lower layer, so that when cooling airflow flows along the auxiliary fins 42, a problem such as interference or blocking does not exist between the auxiliary fins 42. In FIG. 5, the auxiliary fins 42 are columnar bodies with a small volume, and a blocking effect on the cooling airflow is small, so that the cooling airflow quickly enters adjacent main fins 41 and quickly flow, and thus, the cooling airflow can quickly flow in the heat dissipation apparatus, which accelerates heat dissipation of the heat dissipation apparatus. An arrow in FIG. 5 indicates a flow manner of most cooling airflow, and the ventilation structure 44 is not marked in FIG. 5.

A structure and size of the auxiliary fins 42 may be set, for example, set to a cylindrical shape, and a diameter is set within an appropriate range (without affecting basic heat dissipation), so as to better improve heat dissipation efficiency. In contrast, the auxiliary fins 42 in FIG. 4 are tabular bodies, which can enlarge a heat dissipation area of the auxiliary fins 42 and facilitate processing.

Figure 6:
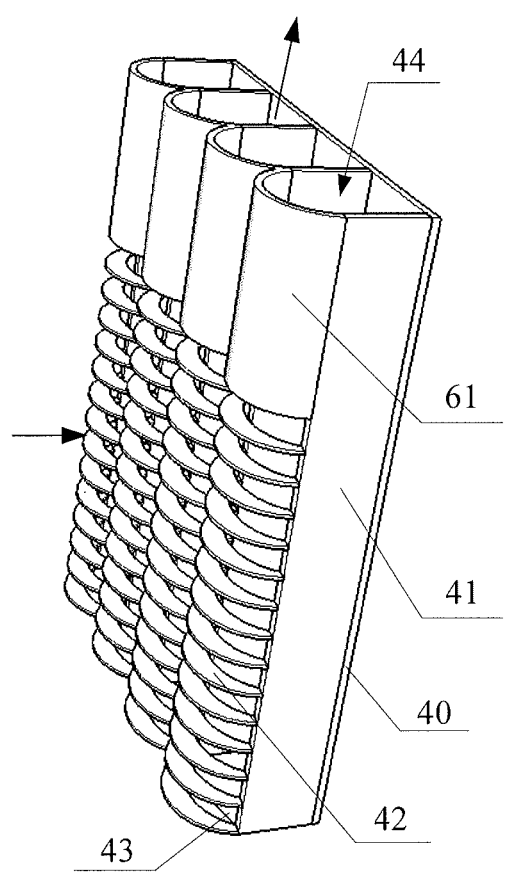

Further, as shown in FIG. 6, a base plate 40 and main fins 41 of a heat dissipation apparatus are of a same structure as those in FIG. 5. In this case, auxiliary fins 42 may be made in a crescent-shaped structure shown in FIG. 6, and between two adjacent main fins 41, multiple auxiliary fins are arranged parallel to each other and with same spacings, or not parallel and with different spacings, and perpendicular to the main fins 41. Specifically, the auxiliary fins 42 may be fastened on top of the main fins 41 by using welding, clamping, or another manner, so as to form an arched structure between two adjacent main fins 41. Correspondingly, in this case, arched plates 61 are disposed between adjacent main fins 41, and the arched plates 61, the main fins 41, and the base plate 40 form a ventilation structure 44. Preferably, a height of the arched plate 61 is equal to a height of an arched shape formed by the crescent-shaped auxiliary fins 42, thereby ensuring that all cooling airflow flowing out between adjacent main fins flows along the ventilation structure 44 and flows out.

In FIG. 6, the auxiliary fins 42 are exposed outside the main fins 41, so that a contact area between the auxiliary fins 42 and cooling airflow can be increased, and after the arched structure is formed, a volume of cooling airflow that flows between the main fins 41 can be increased, thereby improving heat dissipation efficiency. An arrow in FIG. 6 indicates a flow manner of most cooling airflow.

Figure 7:
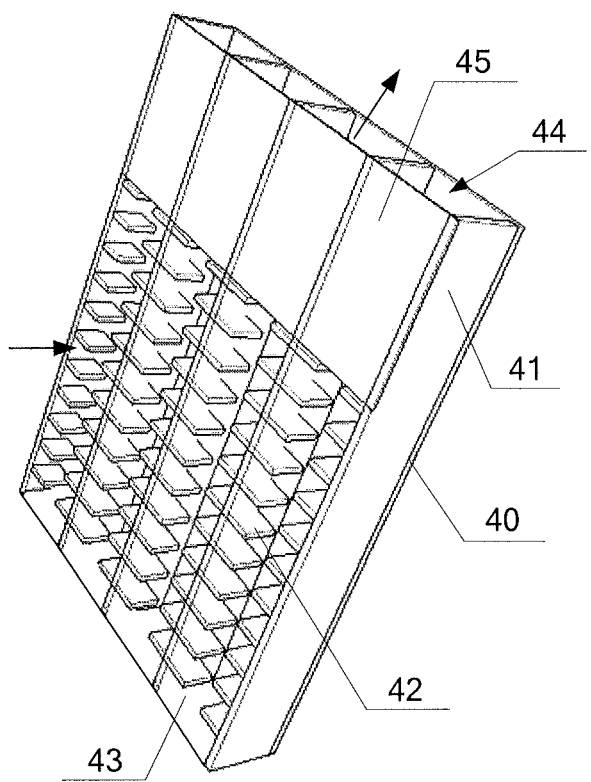

Similar to the structure shown in FIG. 5, as shown in FIG. 7, all parts, except a structure of auxiliary fins 42, are the same as those in FIG. 5. The auxiliary fins 42 are different, and correspondingly, an effect is also different when the auxiliary fins 42 are fastened on main fins 41. In FIG. 7, multiple auxiliary fins 42 are block objects of a same structure, fastened on surfaces of the main fins 41 by using welding, bonding, clamping, or another manner, and perpendicular to the main fins 41. Two groups disposed symmetrically are formed between adjacent main fins 41, a certain gap exists between the two groups, and auxiliary fins 42 in each group are disposed parallel to each other and with same spacings, or not parallel and with different spacings. In FIG. 7, the auxiliary fins 42 of the heat dissipation apparatus are block objects, which facilitates processing and reduces costs. An arrow in FIG. 7 indicates a flow manner of most cooling airflow.

Figure 8:
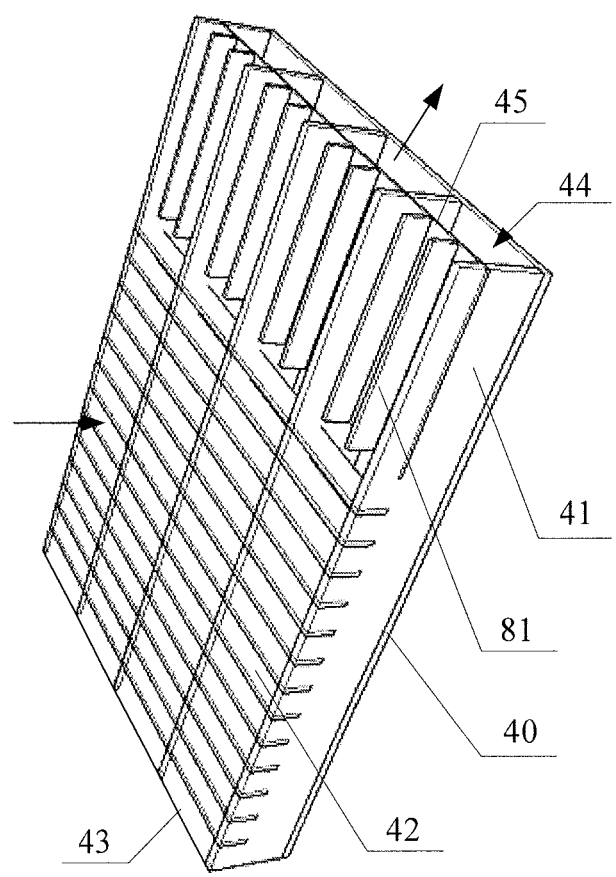

It can be known from the foregoing analysis that, a manner in which the cooling airflow flows out between the main fins 41 and then flows into the ventilation structure 44 is adopted for the ventilation structure 44 of the heat dissipation apparatuses in FIG. 4 to FIG. 7. A structure shown in FIG. 8 may also be adopted. A heat dissipation apparatus shown in FIG. 8 is the same as that shown in FIG. 4, except for a ventilation structure 44. In this case, in FIG. 8, heat dissipation teeth 81 may be disposed on a cover 45, and the heat dissipation teeth 81 may include multiple heat dissipation plates disposed parallel to main fins 41, or may also include multiple columnar bodies that are arranged in a form of a matrix, so that the heat dissipation teeth 81 can be used to improve heat dissipation efficiency of the cooling airflow in the ventilation structure 44. In FIG. 8, auxiliary fins 42 are tabular structures and bring a blocking effect on cooling airflow, so that after the cooling airflow that flows into the heat dissipation apparatus flows along the auxiliary fins 42, most of the cooling airflow flows in gaps between adjacent main fins 41 and between the auxiliary fins 42 and a base plate 40. Therefore, in FIG. 8, the cover 45 is disposed on the same plane as an edge side of the auxiliary fins 42 that are adjacent to the base plate 40, so that most of the cooling airflow still flows along the ventilation structure 44. Considering overall outline design quality, edge sides of the heat dissipation teeth 81 and the main fins 41, which are parallel to and away from the base plate 40, may be located on a same plane. Alternatively, an end side, of the columnar bodies, which is away from the base plate 40 is located on a same plane as an edge side, of the main fins 41, which is parallel to and away from the base plate 40. Certainly, the heat dissipation teeth 81 may also be another appropriate structure.

It should be noted that, a structure of the heat dissipation teeth 81 in FIG. 8 is disposed only when the heat dissipation apparatus is of the structure shown in FIG. 4. Therefore, heat dissipation teeth 81 may also be disposed on the ventilation structure 44 according to the heat dissipation apparatus of different structures in FIG. 5 to FIG. 7, where the heat dissipation teeth 81 correspond to the structures.

When the heat dissipation apparatus is actually used, because the cooling airflow enters the heat dissipation apparatus in various directions, that is, enters the heat dissipation apparatus from up, down, left, right, front, and rear ends of the heat dissipation apparatus after the heat dissipation apparatus has been assembled, so that a structure and a disposition manner of the heat dissipation apparatus are set to make the cooling airflow enter the heat dissipation apparatus in a specific required manner. In FIG. 4 to FIG. 8, by means of disposing the blocking structure 43 and the main fins 41, most cooling airflow (a small amount of airflow still flutters and can be ignored) flows according to a manner indicated by an arrow in a corresponding figure. Therefore, to further improve heat dissipation efficiency of the heat dissipation apparatus, largely improving an air intake area of the heat dissipation apparatus, that is, an air intake volume of the heat dissipation apparatus, may be considered. Details are shown in FIG. 9.

Figure 9:
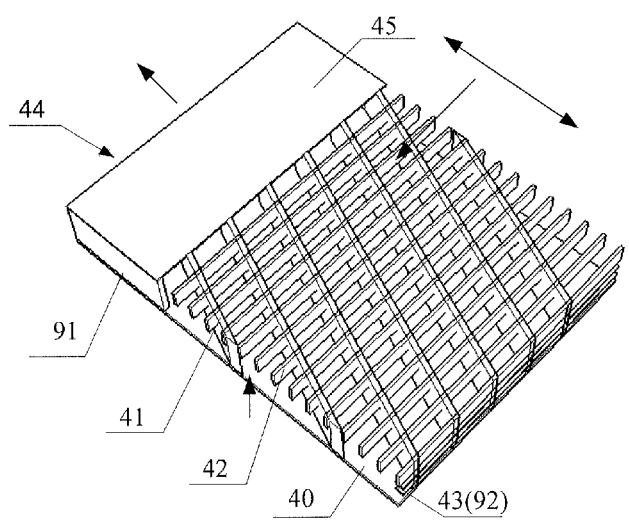

In FIG. 9, multiple main fins 41 may be of a tabular structure and disposed on a base plate 40 in a parallel or slope manner (in a slope manner relative to a side edge of the base plate 40), and adjacent main fins 41 may be disposed with same spacings or with different spacings. Because the main fins 41 are disposed in a slope manner on the base plate 40, the main fins 41 are multiple tabular bodies with different lengths and structures. Specifically, in FIG. 9, directions indicated by a two-way arrow are up and down directions of the base plate, and in the up and down directions of the base plate 40, a length of the main fin 41 account for ¾ of an overall length of the base plate 40. Spacings between adjacent main fins 41 and a slope angle of the main fins 41 may be determined according to multiple tests and experience of a technical person. In addition, in FIG. 9, the slope angle of the main fins 41 is relative to the up and down directions of the base plate 40.

In FIG. 9, multiple auxiliary fins 42 are also tabular bodies of a same structure and may also be fastened on the main fins 41 in the plug-in manner as shown in FIG. 4. The multiple auxiliary fins 42 are arranged parallel to each other and with same spacings, or not parallel and with different spacings, and a certain angle exists between the auxiliary fins and the main fins. In this case, in FIG. 9, the auxiliary fins 42 are disposed parallel to a side edge of the base plate 40. Specifically, the auxiliary fins 42 are perpendicular to the up and down directions of the base plate 40, so that the angle between the auxiliary fins 42 and the main fins 41 is the slope angle of the main fins 41.

In FIG. 9, because a length of the base plate 40 occupied by the main fins 41 is limited, support plates 91 may be disposed on the base plate 40, and a cover 45 is disposed on the support plates 91, so that the cover 45, the support plates 91, and the base plate 40 form a ventilation structure 44, and the ventilation structure 44 and a blocking structure 43 may be disposed according to the slope angle of the main fins 41.

Specifically, as shown in FIG. 9, the slope angle of the main fins 41 is small. Therefore, to ensure that most cooling airflow still first flows along the auxiliary fins 42 and then flows between adjacent main fins 41, and a small amount of additional cooling airflow flows into the heat dissipation apparatus along a slope entrance of the main fins 41, the slope angle of the main fins 41 is small in FIG. 9. When a quantity and the slope angle of the main fins 41 in FIG. 9 are used, the amount of cooling airflow that directly flows in a gap between connected main fins 41 is small, and most cooling airflow still first flows along the auxiliary fins 42, thereby also effectively reducing heat of the auxiliary fins 42. When the quality of the main fins 41 in FIG. 9 is used but the slope angle of the main fins 41 is larger, a position of the blocking structure 13 may be adjusted, so as to ensure a flow manner of most cooling airflow.

Figure 10:
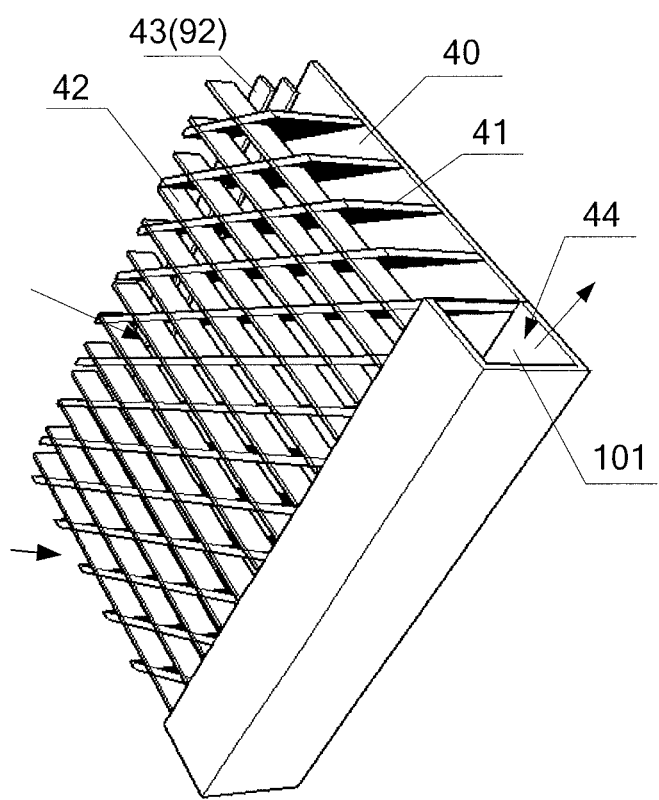

In FIG. 9, the blocking structure 43 may be disposed at one end in the up and down directions of the base plate 40, and may be one auxiliary fin 42 that is disposed at the end and a separating plate 92 that is parallel to the base plate 40 and disposed between the auxiliary fin 42 and the base plate 40. In this case, the one auxiliary fin 42 disposed at the end also brings a blocking effect. Correspondingly, the ventilation structure 14 is disposed at the other end in the up and down directions of the base plate 40, and an air intake vent and an air exhaust vent of the ventilation structure 14 may be disposed in an opposite manner, as shown in FIG. 9; or may also be disposed in an adjacent manner, as shown in FIG. 10. In addition, in FIG. 10, an air exhaust vent 101 needs to be provided along a slope direction of the main fins, so as to ensure liquidity and smoothness of the cooling airflow entering the ventilation structure 14. In FIG. 9, a one-way arrow indicates a flow manner of the cooling airflow.

Figure 11:
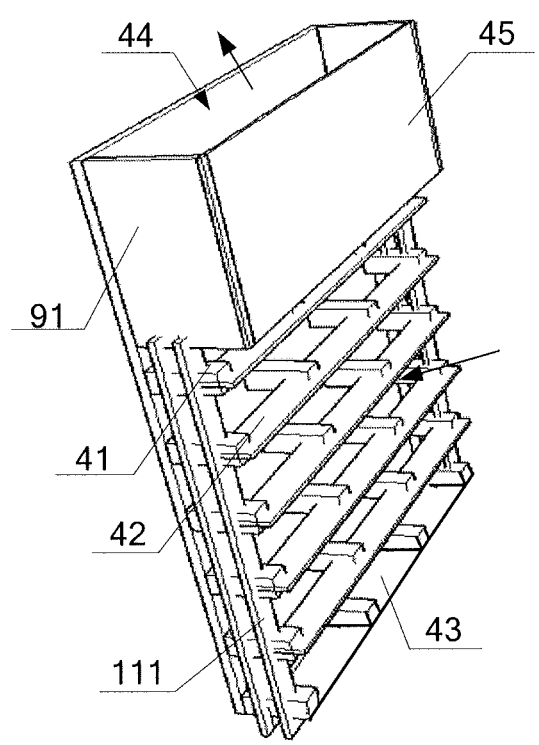

When the cooling airflow in various directions is fully used, a heat dissipation apparatus shown in FIG. 11 may also be used. In FIG. 11, multiple main fins 41 may be columnar bodies of a same structure and arranged on a base plate 40 in a form of a matrix. Multiple auxiliary fins 42 may still be tabular structures of a same structure and separately fastened on each row of the main fins 41. The multiple auxiliary fins 42 are disposed parallel to each other and with same spacings, or not parallel and with different spacings. The main fins 41 are columnar bodies and cannot easily support and fasten the cover and the like. Therefore, support plates 91 may be disposed on the base plate 40, and a cover 45 is disposed on the support plates 91, so that the cover 45, the support plates 91, and the base plate 40 together form a ventilation structure 44, and the ventilation structure 44 is located on one side of the main fins. In FIG. 11, a blocking structure 43 is a baffle plate perpendicular to the base plate 40, and the baffle plate and the ventilation structure 44 are respectively located on two sides of the main fins 41, so that cooling airflow can first flow along the auxiliary fins 42, then flow between adjacent main fins 41 (without a specific flow channel and direction), and finally flow into the ventilation structure 44 and flow out due to a cross ventilation effect. The blocking structure 43 may be fastened on a horizontal row of main fins 41.

In FIG. 11, the main fins 41 are columnar bodies, and lengthwise channels formed between main fins 41 have no specific regularity. In addition, in FIG. 11, a blocking effect of the main fins 41 on the cooling airflow is small. Therefore, when the cooling airflow enters the heat dissipation apparatus from two sides of the base plate 40, the cooling airflow cannot properly dissipate heat for the auxiliary fins 42, and a flow manner of other airflow is easily affected. Therefore, a baffle plate 111, also called a separating plate 111, which is parallel to the base plate 40, may be disposed on vertical main fins 41 that are on the two sides of the base plate 40. A quality of the separating plates 111 is determined according to a requirement, so as to reduce a volume of cooling airflow that enters from this area, and ensure that most cooling airflow first flows along the auxiliary fins 42 and then flows into the ventilation structure 44 and flows out. The separating plate 111 also provides functions of thermal conduction and heat dissipation.

The columnar auxiliary fins 42 may be of a cylindrical structure, a cuboid structure, or a wedge-shaped structure.

Figure 12:
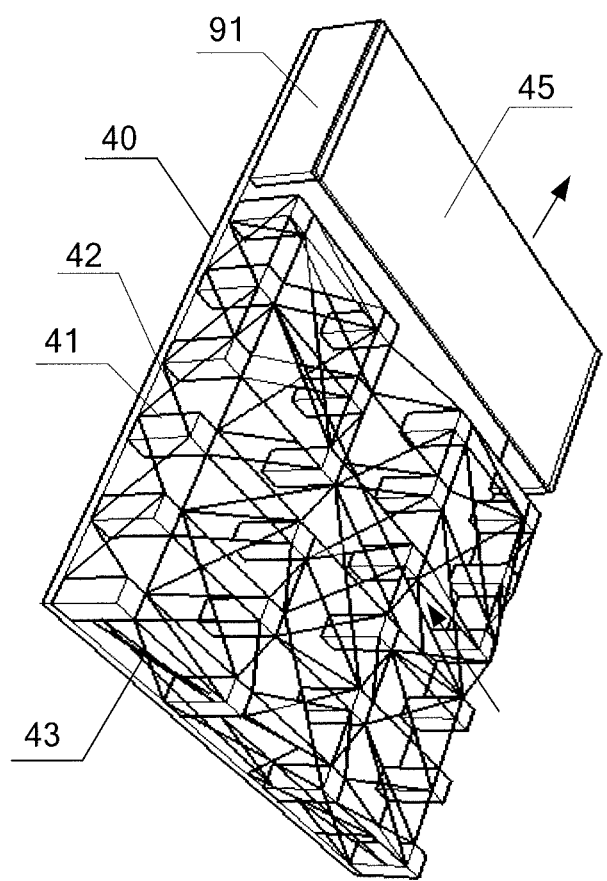

In addition, to make the cooling airflow enter the heat dissipation apparatus in various directions, a structure shown in FIG. 12 may be adopted. Comparing the heat dissipation apparatus in FIG. 12 with the heat dissipation apparatus in FIG. 11, no separating plate 111 is disposed in FIG. 12, and other parts are the same except for auxiliary fins 42 and a blocking structure 43. Specifically, in FIG. 12, auxiliary fins 42 are wire strips and connected between main fins 41 in a staggered manner. A blocking effect of the wire strips on cooling airflow is small. Therefore, the cooling airflow can enter the heat dissipation apparatus in various directions. In FIG. 12, a blocking structure 43 is a lap-joint wire structure formed by the auxiliary fins 42 that are intertwined densely and is similar to a meshed object. The auxiliary fins 42 form, by dense disposition, a meshed object, that is, the blocking structure 43, on a row of main fins 41 that are away from the ventilation structure 44, thereby ensuring that most cooling airflow flows according to a flow manner shown in FIG. 12. Likewise, on the two sides of a base plate 40, an air intake volume of cooling airflow in areas of the two sides may also be limited by densely disposing the auxiliary fins.

Preferably, the auxiliary fins 42 in FIG. 12 may be made of a material with good thermal conduction and heat dissipation performance and a low price, for example, aluminum wires or copper wires.

Figure 13:
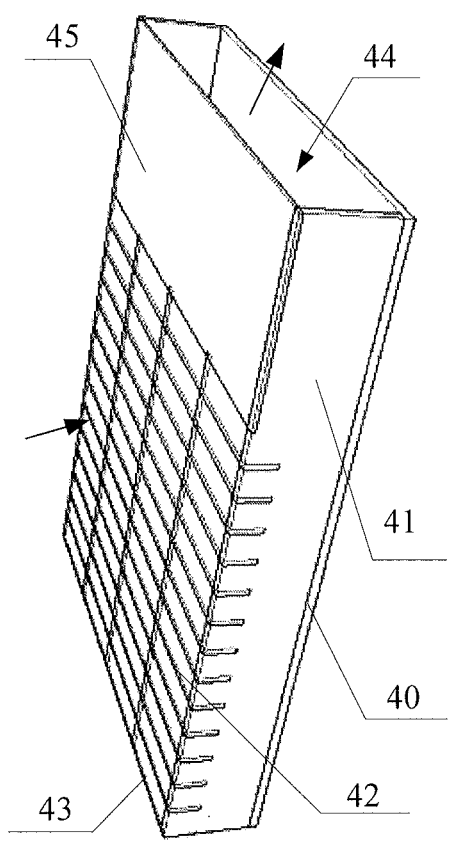

It can be easily figured out that, in FIG. 4 to FIG. 8, there are multiple ventilation structures formed in the heat dissipation apparatus, and in FIG. 9 to FIG. 12, there is only one ventilation structure formed in the heat dissipation apparatus. In the former apparatus, a volume of each ventilation structure 14 is small, which can improve a flow rate of cold airflow in the ventilation structure and improve heat dissipation efficiency. The latter apparatus may be considered as being overall ventilated, and cooling airflow flows more smoothly. Certainly, the two may also be replaced with each other by means of disposition. For example, in FIG. 13, a part of the main fins 41 in FIG. 4 that form the ventilation structure 44 are shortened, and lengths of main fins 41 on two end sides remain the same, so that the cover 45 is disposed on the main fins 41 on the two end sides and forms one ventilation structure 44 with the base plate 40.

In addition, in the heat dissipation apparatuses shown in FIG. 4 to FIG. 13, both the main fins 41 and the auxiliary fins 42 may be made of a metal material.

Figure 14:
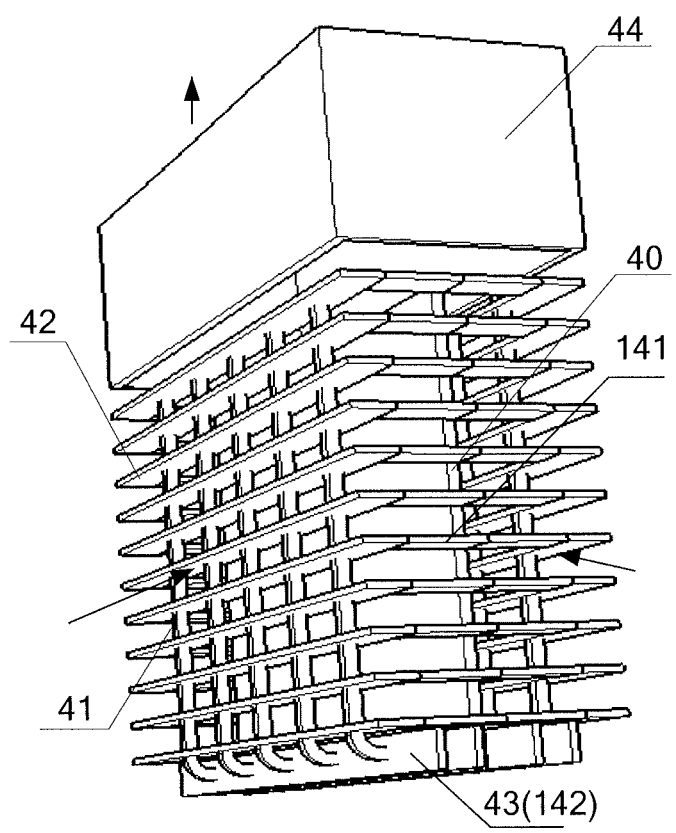

In FIG. 4 to FIG. 13, a flow direction of the cooling airflow is changed to achieve a purpose of improving heat dissipation efficiency of all heat dissipation apparatuses. Alternatively, a structure of the main fins 41 may be essentially changed to further improve heat dissipation efficiency of the heat dissipation apparatuses. Details are shown in FIG. 14. In FIG. 14, multiple main fins 41 may be tubular bodies of a same structure and fastened on a base plate 40 parallel to each other and with same spacings, or not parallel and with different spacings. Multiple auxiliary fins 42 are tubular bodies of a same structure, arranged on the main fins 41 parallel to each other and with same spacings, or not parallel and with different spacings, and perpendicular to the main fins 41. The main fins 41 are tubular bodies and have a poor fastening effect. Therefore, bracket plates 141 may be disposed at two ends of the base plate 40, so as to steadily fasten the auxiliary fins 42. The bracket plates 141 and the auxiliary fins 42 are disposed in parallel on a same plane. Lengths of the bracket plates 141 in a direction perpendicular to the main fins is set, so as to limit an air intake volume of cooling airflow that is on two sides of the base plate 40 and flows from this area, and ensure that most cooling airflow flows according to a manner shown in FIG. 14. Through-holes may be provided on the auxiliary fins 42, so that the tubular main fins 41 may be disposed through the through-holes to complete fastening connections.

In FIG. 14, a ventilation structure 44 may be formed by disposing a support frame on a base plate 40 and disposing a cover on the support frame; or may also be disposed as an independent hollow cuboid similar to a chimney structure and preferably fastened on the base plate 40 or a corresponding component, and so on. A blocking structure 43 may be a baffle plate 142 that is in an extending direction of the main fins and opposite to the ventilation structure 44 and may also be called a separating plate 142. The separating plate 142 is corresponding to a position between auxiliary fins 42 and the base plate 40 and disposed parallel to the base plate 40. Auxiliary fins 42 adjacent to the separating plate 142 may also provide a separating function.

Specifically, when a heat dissipation apparatus shown in FIG. 14 is used, a disposition may be performed according to an application scenario and environment. In FIG. 14, main fins 41 and auxiliary fins 42 exist on both sides of the base plate 40 and are disposed on the two sides of the base plate 40. The ventilation structure 44 is one integrated structure and disposed corresponding to the fins on the two sides. In FIG. 14, a certain gap exists between the ventilation structure 44 and the base plate 40, which facilitates flowing of cooling airflow. Correspondingly, separating plates 142 are also disposed symmetrically.

In addition, in FIG. 14, the main fins 41 on the two sides of the base plate 40 may also be correspondingly connected.

Preferably, the main fins 41 may be water pipes or heat pipes made of a graphite material or a rigid material, for example, aluminum water pipes. Cooling water may be set to be piped into the water pipes, so as to directly cool the main fins 41 and further improve heat dissipation efficiency of the heat dissipation apparatus.

Figure 15:
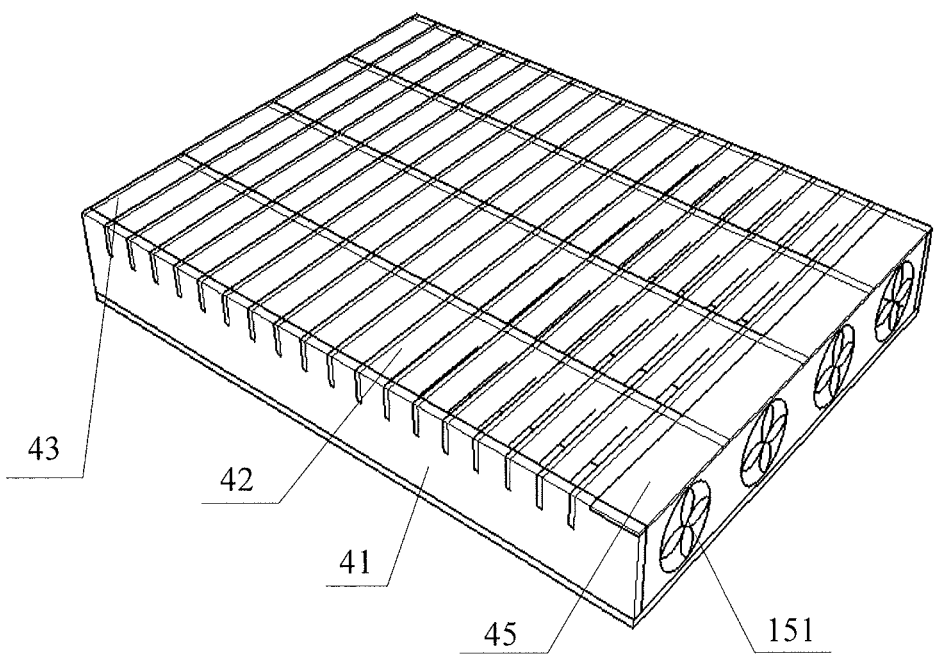

Further, a fan may be disposed in an exhaust position of the cooling airflow, so as to effectively improve a cross ventilation effect and improve heat dissipation efficiency. In an actual manufacturing process, a heat dissipation apparatus includes a ventilation structure 44, therefore, as shown in FIG. 15, a fan 151 may be disposed at an air exhaust vent of the ventilation structure (which is not shown in FIG. 15), so as to improve a cross ventilation effect and improve heat dissipation efficiency. When the fan is disposed, the ventilation structure may also not be disposed in the heat dissipation apparatus; instead, the fan is directly disposed at an air exhaust vent of cooling airflow.

It should be noted that, the ventilation structure 44 in FIG. 4 to FIG. 14 may be of a similar hollow cuboid structure or a structure that is formed with other parts (such as the main fins 41 and the base plate 40) and has a same function, and may be disposed, by appropriate layout, with a heat dissipation tooth structure or another structure that can effectively improve heat dissipation efficiency.

The main fins 41, auxiliary fins 42, blocking structures 43, and ventilation structures 44 of different structures in multiple different embodiments corresponding to FIG. 4 to FIG. 14 may be properly combined and assembled, so as to form more heat dissipation apparatuses applicable to different scenarios and environments.

In the descriptions of the present invention, it should be understood that, directions or position relationships indicated by the terms "center", "up", "down", "front", "rear", "left", "right", "vertical", "horizontal", "top", "bottom", "inside", "outside", and the like are based on the directions or position relationships shown in the accompanying drawings, and are merely intended to describe the present invention and simplify the descriptions, but are not intended to indicate or imply that an apparatus or a component shall have a specific direction or be formed and operated in a specific direction, and therefore shall not be understood as a limitation on the present invention.

The terms "first" and "second" are merely intended for a purpose of description, and shall not be understood as an indication or implication of relative importance or implicit indication of the number of indicated technical features. Therefore, a feature limited by "first" or "second" may explicitly or implicitly include one or more of the feature. In the descriptions of the present invention, "multiple" means two or more than two, unless otherwise specified.

In the descriptions of the present invention, it should be noted that, unless otherwise specified and limited explicitly, the terms "mounting", "connected", and "connection" shall be understood in a general manner, for example, may be a fixed connection, a detachable connection, or an integrated connection; and may be a direct connection, an indirect connection by using an intermediate medium, or an internal connection between two components. A person of ordinary skill in the art may understand specific meanings of the foregoing terms in the present invention according to a specific situation.

In the descriptions of this specification, specific characteristics, structures, materials, or features may be combined in an appropriate manner in any one or more embodiments or examples.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A heat dissipation apparatus, comprising:
a base plate;
a plurality of main fins disposed on the base plate;
a plurality of auxiliary fins disposed across the plurality of main fins forming a plurality of gaps between the plurality of the auxiliary fins and the base plate, and an additional plurality of gaps are between adjacent pairs of main fins among the plurality of the main fins; and
a blocking structure, wherein:
   each of the plurality of main fins extends on a surface of the base plate,
   each of the plurality of the main fins is disposed parallel to each other,
   lengthwise air ducts are formed in the additional plurality of gaps between adjacent pairs of the plurality of main fins,
   each of the plurality of the main fins is a tabular body and disposed in a parallel manner relative to a side edge of the base plate,
   each of the plurality of auxiliary fins is a tabular body and arranged parallel to each other on the plurality of main fins, and each of the plurality of auxiliary fins is fastened on the plurality of main fins in a plug-in manner and disposed perpendicular to the plurality of main fins,
   the blocking structure is extended at a first end of the base plate and on the surface of the base plate, and the blocking structure is a baffle plate disposed between the adjacent pairs of the plurality of main fins, at the first end of the base plate, and perpendicular to the plurality of main fins,
   a cover is disposed on a part of the plurality of main fins that is adjacent to a second end of the base plate, the second end of the base plate being opposite to the first end of the base plate where the blocking structure is extended, and
   the cover, the plurality of main fins, and the base plate form a ventilation structure at an exhaust position of a cooling airflow.

2. A heat dissipation apparatus, comprising:
a base plate;
a plurality of main fins disposed on the base plate;
a plurality of auxiliary fins disposed across the plurality of main fins forming a plurality of gaps between the plurality of auxiliary fins and the base plate, and an additional plurality of gaps are between adjacent pairs of main fins among the plurality of main fins; and
a blocking structure, wherein:
   each of the plurality of main fins extends on a surface of the base plate,
   each of the plurality of the main fins is disposed parallel to each other,
   lengthwise air ducts are formed in the additional plurality of gaps between the adjacent pairs of the plurality of main fins,
   each of the plurality of the main fins is a columnar body of a same structure and arranged on the base plate as a matrix,
   each of the plurality of auxiliary fins is a wire strip, and is connected between each of the plurality of main fins in a staggered manner,
   the blocking structure is extended at a first end of the base plate and on the surface of the base plate,
   the blocking structure is a lap-joint wire structure formed by densely intertwined auxiliary fins and located between a horizontal row of main fins that are adjacent to the first end of the base plate,
   support plates are disposed on and perpendicular to the base plate at an end side of the base plate opposite to the blocking structure,
   a cover is parallel to the base plate and is disposed on the support plates,
   the cover, the support plates, and the base plate form a ventilation structured, and
   an air intake vent of the ventilation structure is corresponding to an air exhaust vent of the lengthwise air duct.

3. The heat dissipation apparatus according to claim 2, wherein the plurality of the auxiliary fins are aluminum wires or copper wires.

4. The heat dissipation apparatus according to claim 1, wherein a material of the plurality of the main fins is a metal material.

5. A heat dissipation apparatus, comprising:
a base plate;
a plurality of main fins disposed on the base plate;
a plurality of auxiliary fins disposed across the plurality of main fins forming a plurality of gaps between the plurality of the auxiliary fins and the base plate, and an additional plurality of gaps are between adjacent pairs of main fins among the plurality of main fins; and
a blocking structure, wherein:
   each of the plurality of main fins extends on a surface of the base plate,
   each of the plurality of the main fins is disposed parallel to each other,
   lengthwise air ducts are formed in the additional plurality of gaps between adjacent pairs of the plurality of main fins,
   each of the plurality of the main fins is a tabular structure disposed diagonally relative to a side edge of the base plate,
   each of the plurality of auxiliary fins is a tabular body of a same structure arranged parallel to each other on the plurality of main fins and is fastened on the plurality of main fins in a plug-in manner,
   a predetermined angle exists between the plurality of auxiliary fins and the plurality of main fins,
   the blocking structure is a baffle plate disposed at a first end of the base plate and perpendicular to the side edge of the base plate,
   support plates are disposed on and perpendicular to the base plate at an end side of the base plate opposite to the blocking structure,
   a cover is parallel to the base plate and is disposed on the support plates, the cover, the support plates, and the base plate form a ventilation structure, and an air intake vent of the ventilation structure is corresponding to an air exhaust vent of the lengthwise air ducts.

6. The heat dissipation apparatus according to claim 5, wherein:

the air exhaust vent of the ventilation structure is provided at one end of the ventilation structure that is opposite to the air intake vent; or the air exhaust vent of the ventilation structure is provided at one end of the ventilation structure that is adjacent to the air intake vent and corresponding to a slope direction of the plurality of main fins.

\* \* \* \* \*

UNITED STATES PATENT AND TRADEMARK OFFICE
CERTIFICATE OF CORRECTION

PATENT NO. : 11,604,035 B2
APPLICATION NO. : 14/525733
DATED : March 14, 2023
INVENTOR(S) : Zaizhong Xia, Yun Tang and Wen Fang It is certified that error appears in the above-identified patent and that said Letters Patent is hereby corrected as shown below:

In the Claims

In Column 16, In Line 25, In Claim 2, delete "structured," and insert -- structure, --.

Signed and Sealed this
Tenth Day of October, 2023

Katherine Kelly Vidal
Director of the United States Patent and Trademark Office